(12) United States Patent
Lee

(10) Patent No.: US 7,696,043 B2
(45) Date of Patent: Apr. 13, 2010

(54) METHOD OF MANUFACTURING A FLASH MEMORY DEVICE

(75) Inventor: Byoung Ki Lee, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 163 days.

(21) Appl. No.: 11/768,722

(22) Filed: Jun. 26, 2007

(65) Prior Publication Data

US 2008/0003749 A1   Jan. 3, 2008

(51) Int. Cl.
*H01L 21/336* (2006.01)
(52) U.S. Cl. .............. 438/257; 438/259; 438/263; 257/E21.68; 257/E21.645; 257/E29.33
(58) Field of Classification Search .......... 438/257, 438/259; 257/316, 334, E21.68, E21.645, 257/E29.33
See application file for complete search history.

(56) References Cited

U.S. PATENT DOCUMENTS

| | | | |
|---|---|---|---|
| 6,204,122 B1 | 3/2001 | Joo et al. | |
| 6,825,526 B1 * | 11/2004 | He et al. | 257/317 |
| 2004/0191992 A1 * | 9/2004 | Ni et al. | 438/259 |
| 2005/0095784 A1 * | 5/2005 | Yang | 438/257 |
| 2006/0033150 A1 * | 2/2006 | Shin | 257/316 |
| 2006/0187711 A1 * | 8/2006 | Jang | 365/185.15 |

FOREIGN PATENT DOCUMENTS

| | | |
|---|---|---|
| JP | 10-116926 | 5/1998 |
| KR | 10-2001-0003086 | 1/2001 |
| KR | 10-2002-0058597 | 7/2002 |
| KR | 10-2002-0059473 | 7/2002 |
| KR | 10-2002-0067787 | 8/2002 |
| KR | 10-2003-0073937 | 9/2003 |
| KR | 10-2004-003895 | 1/2004 |
| KR | 10-2004-0045110 | 6/2004 |
| KR | 10-2004-0049902 | 6/2004 |
| KR | 10-2005-0069513 | 7/2005 |

\* cited by examiner

*Primary Examiner*—Alexander G Ghyka
*Assistant Examiner*—Abdulfattah Mustapha
(74) *Attorney, Agent, or Firm*—Marshall, Gerstein & Borun LLP

(57) ABSTRACT

A method of manufacturing a flash memory device includes the steps of forming trenches by forming a tunnel oxide layer and a conductive layer for a floating gate over a semiconductor substrate, and then etching a portion of the conductive layer, the tunnel oxide layer and the semiconductor substrate to form the trenches, filling the trenches with an insulating layer to form isolation layers projecting above the floating gate, forming spacers on sidewalls of the isolation layers projecting above the floating gate, etching the conductive layer using the spacers as a mask, thereby forming a U-shaped conductive layer, removing the spacers, etching the top surface of the isolation layers, thereby controlling an Effective Field Height (EFH) of the isolation layer, and forming a dielectric layer and a conductive layer for a control gate on the resulting surface.

10 Claims, 3 Drawing Sheets

METHOD OF MANUFACTURING A FLASH MEMORY DEVICE

CROSS-REFERENCE TO RELATED APPLICATION

Priority to Korean patent application number 2006-59522, filed on Jun. 29, 2006, the disclosure of which is incorporated by reference in its entirety, is claimed.

BACKGROUND OF THE INVENTION

The invention relates, in general, to flash memory devices and, more particularly, to a method of manufacturing a flash memory device in which interference between floating gates can be reduced and the coupling ratio can be increased.

In a NAND flash memory device, a plurality of cells for storing data are connected in series to form one string. A drain select transistor and a source select transistor are formed between the cell string and the drain and between the cell string and the source, respectively. In the cell of the NAND flash memory device, a gate in which a tunnel oxide layer, a floating gate, a dielectric layer and a control gate are stacked is formed at a specific region on a semiconductor substrate. Junctions are formed at both sides of the gate.

In the NAND flash memory device constructed above, the state of the cell is influenced by the operation of neighboring cells. It is therefore very important to maintain a constant cell state. A phenomenon in which the state of the cell is changed due to the operation of neighboring cells (i.e., a program operation) is called an interference phenomenon. In other words, if a second cell adjacent to a first cell to be read is programmed, a threshold voltage higher than that of the first cell is read due to a capacitance phenomenon caused by a change in the charges of the floating gate of the second cell. Therefore, although the charge of the floating gate of the first cell is not changed, the actual state of the first cell appears distorted due to a change in the state of neighboring cells. The state of the cell is changed due to the interference phenomenon, resulting in a degraded yield of the failure ratio. Accordingly, it is desirable to maintain a constant cell state by minimizing the interference phenomenon.

Meanwhile, in a manufacturing process of a general NAND flash memory device, part of the isolation layer and the floating gate is formed using a Self-Aligned Shallow Trench Isolation (SA-STI) process. The process is described below with reference to FIG. 1.

A tunnel oxide layer 11 and a first polysilicon layer 12 are formed over a semiconductor substrate 10. Specific regions of the first polysilicon layer 12 and the tunnel oxide layer 11 are etched. The semiconductor substrate 10 is etched to a specific depth, forming trenches. The trenches are filled with an insulating layer. A polish process is then performed to form isolation layers 13 in the trenches. Thereafter, a second polysilicon layer 14 is formed and then etched to form floating gates 12 and 14. A dielectric layer 15 and a third polysilicon layer 16 for a control gate are formed over the floating gates 12 and 14.

If the flash memory device is fabricated by the SA-STI process described above, interference may occur between the first polysilicon layers 12 because the isolation layers 13 are formed between neighboring first polysilicon layers 12 serving as the floating gates.

FIG. 2 is a graph illustrating the floating gate interference coupling ratio as a function of floating gate height and the gate-to-gate distance between floating gates of a flash memory device.

Referring to FIG. 2, inter-gate interference is inversely proportional to the distance between the floating gates and proportional to the height of the floating gate. In other words, if the distance between the floating gates increases and the height of the floating gate decreases, interference is reduced. However, if the height of the floating gate decreases, the interface area of the floating gate and the control gate is reduced and the coupling ratio is reduced.

SUMMARY OF THE INVENTION

Accordingly, the invention addresses the above problems and provides a manufacturing method for a flash memory device. In the method, a floating gate is partially etched to have a U-shaped form so that the interfacial area between the floating gate and a control gate can be increased and the coupling ratio can be increased accordingly. A portion of an isolation layer between the floating gates is etched so that the control gate to be formed subsequently is disposed between the floating gates, thereby reducing the interference phenomenon.

According to an aspect of the invention, a method of manufacturing a flash memory device includes the steps of forming trenches by forming a tunnel oxide layer and a conductive layer for a floating gate over a semiconductor substrate, and then etching a portion of the conductive layer, the tunnel oxide layer and the semiconductor substrate to form the trenches, filling the trenches with an insulating layer to form isolation layers projecting above the floating gate, forming spacers sidewalls of the isolation layers projecting above the floating gate, etching the conductive layer using the spacers as a mask, thereby forming a U-shaped conductive layer, removing the spacers, etching the top surface of the isolation layers, thereby controlling an Effective Field Height (EFH) of the isolation layer, and forming a dielectric layer and a second conductive layer for a control gate on the resulting surface.

DESCRIPTION OF SPECIFIC EMBODIMENTS

Now, a specific embodiment of the disclosure is described with reference to the accompanying drawings.

FIGS. 3 to 8 are cross-sectional views illustrating a method of manufacturing a flash memory device according to an embodiment of the invention.

Figure 1:
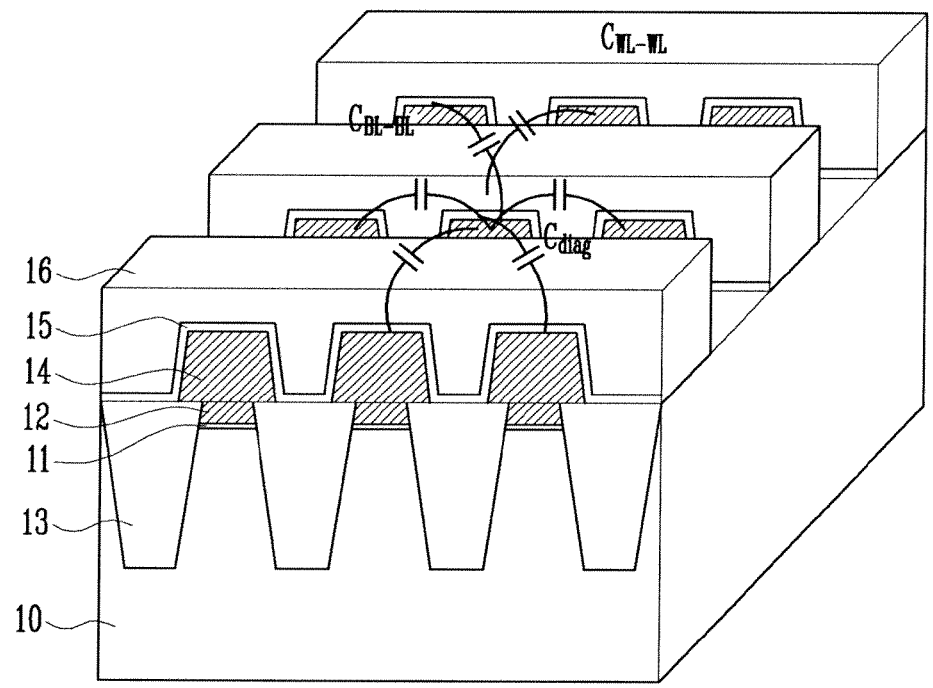
FIG. 1 is a cross-sectional view illustrating a conventional method of manufacturing a flash memory device.
Figure 2:
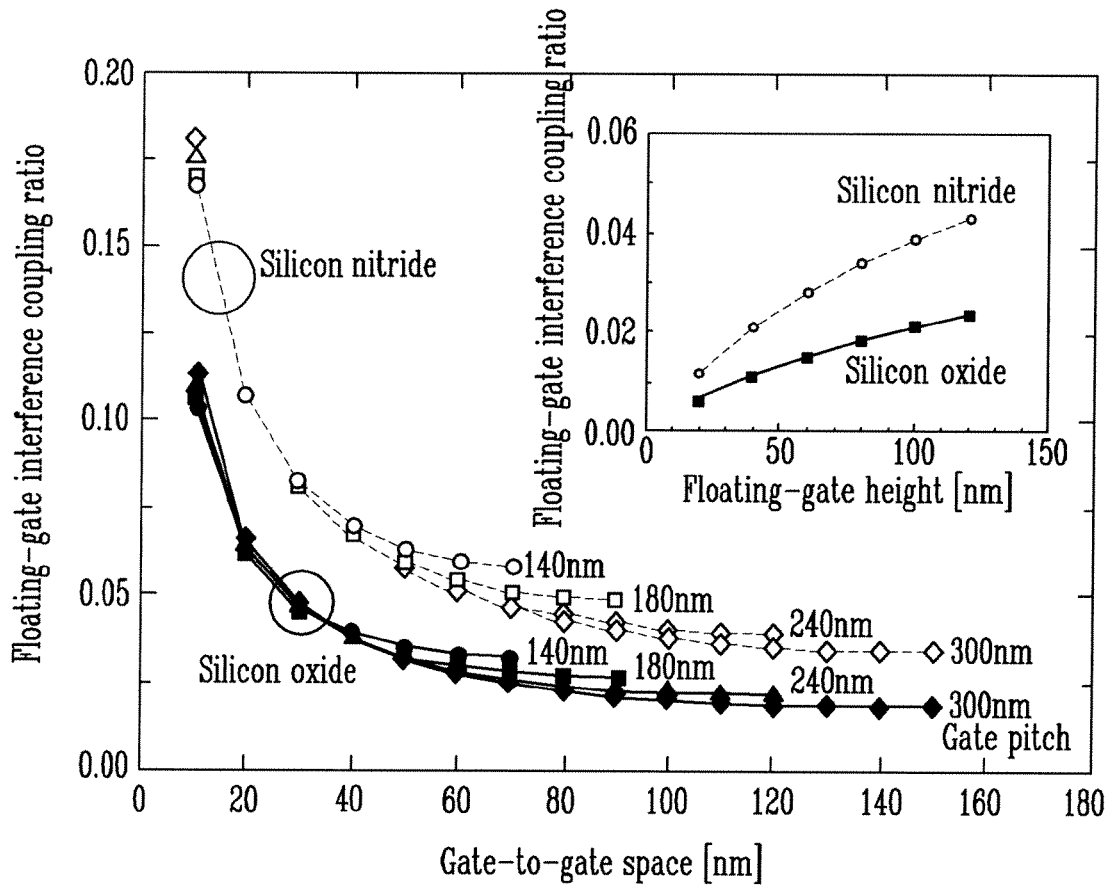
FIG. 2 is a graph illustrating the floating gate interference coupling ratio as a function of floating gate height and distance between floating gates of a flash memory device.
Figure 3:
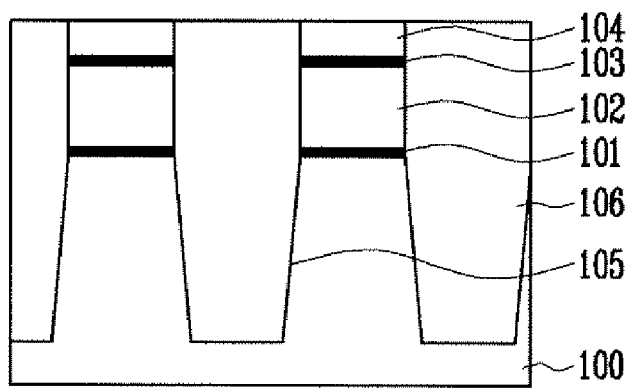
FIGS. 3 to 8 are cross-sectional views illustrating a method of manufacturing a flash memory device according to an embodiment of the invention.

Referring to FIG. 3, a wall formation ion implant process and an ion implant process for controlling the threshold voltage are performed on a semiconductor substrate 100. A tunnel oxide layer 101, a conductive layer 102 for a floating gate, a buffer oxide layer 103, a nitride layer 104 for a hard mask are sequentially formed over the semiconductor substrate 100. The conductive layer 102 can be formed of a polysilicon layer. The buffer oxide layer 103 protects the conductive layer 102 when removing the nitride layer 104. Thereafter, the buffer oxide layer 103, the conductive layer 102, and the tunnel oxide layer 101 are selectively etched by using an etch process using the nitride layer 104 as a mask. The semiconductor substrate 100 is etched to form trenches 105.

An insulating layer, such as a high density plasma (HDP) oxide layer, is formed on the entire surface so that the trenches 105 are filled. A polishing process, such as a chemical-mechanical polish (CMP), is performed on the insulating layer such that the nitride layer 104 is exposed, thereby forming isolation layers 106 within the trenches 105.

Figure 4:
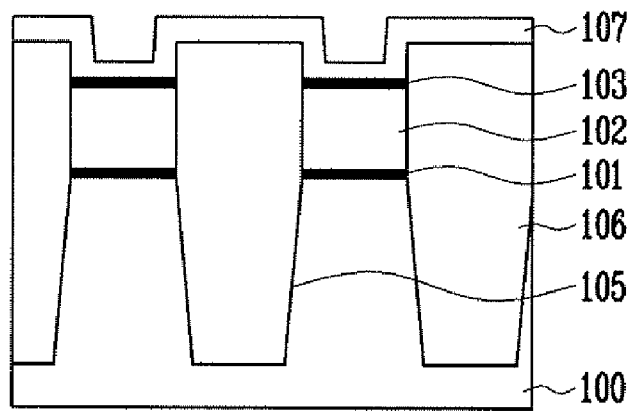

Referring to FIG. 4, an etch process is performed to remove the nitride layer 104. Thereafter, an oxide layer 107 is formed above the entire resulting structure of the semiconductor substrate 100 including the isolation layer 106 and the conductive layer 102. The oxide layer 107 is preferably formed to a thickness of 50 Angstrom to 100 Angstrom.

Figure 5:
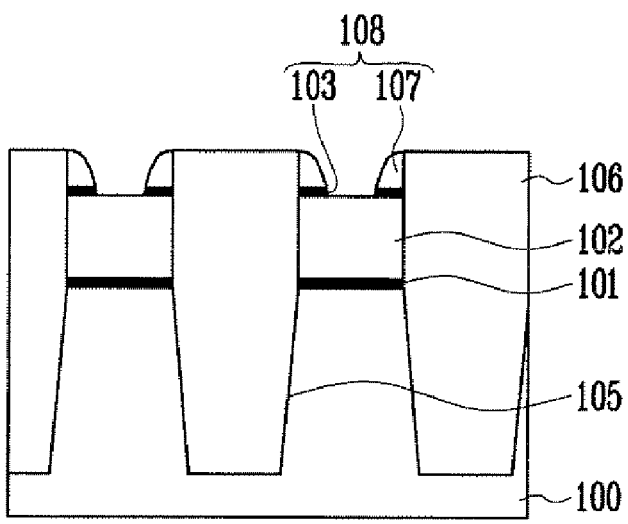

Referring to FIG. 5, an etch process is performed to form spacers 108 including a portion of the oxide layer 107 and a portion of the buffer oxide layer 103 remaining only on the side walls of the exposed isolation layer 106.

Figure 6:
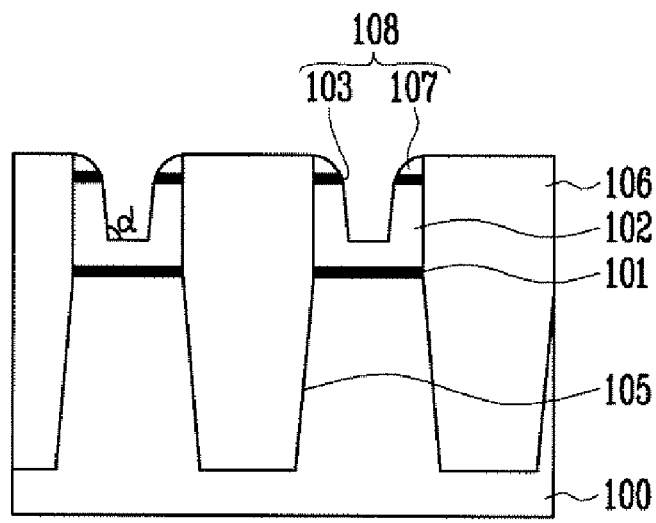

Referring to FIG. 6, the top surface of the conductive layer 102 is etched by an etch process using the spacers 108 as etch masks, so that the conductive layer 102 has a ⊔shape, that is, a U shape. The etch process is preferably performed by using $HBr/O_2$, $HBr/Cl_2/O_2$ or $Cl_2/O_2$ having a high selectivity with respect to an oxide layer. Further, the thickness of the bottom of the conductive layer 102, (i.e. the distance from the tunnel oxide layer 101 to the bottom of the U-shaped gap defined by the etched conductive layer 102) preferably ranges from 300 Angstroms to 500 Angstroms. Furthermore, an angle α formed by an inner sidewall and the bottom of the etched conductive layer 102 is preferably in the range of 91 to 95 degrees.

Figure 7:
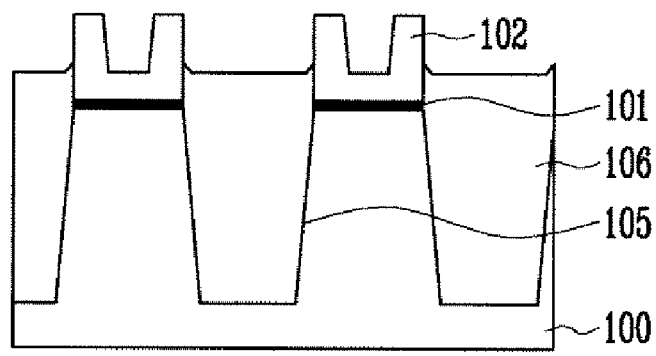

Referring to FIG. 7, an etch process is performed to remove the spacers 108. An oxide layer recess process is then performed in order to lower an Effective Field Height (EFH) of the isolation layer 106, which can be an oxide layer (e.g., an HDP oxide layer). The EFH is preferably within a range of 200 to Angstroms 400 Angstroms.

Figure 8:
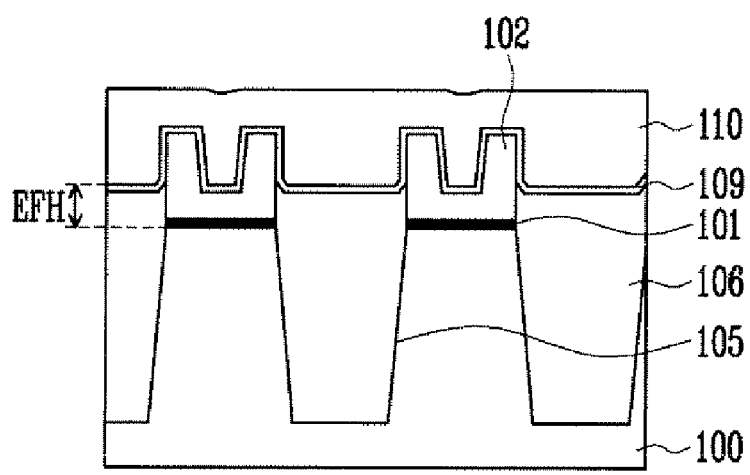

Referring to FIG. 8, a dielectric layer 109 is formed on the entire structure of the semiconductor substrate 100, including the conductive layer 102 having the U shape. The dielectric layer 109 preferably has an oxide-nitride-oxide (ONO) structure in which a first oxide layer, a nitride layer and a second oxide layer are sequentially formed.

A conductive layer 110 for a control gate is formed on the dielectric layer 109. The conductive layer 110 is preferably formed of a polysilicon layer. The dielectric layer 109 and the conductive layer 110 completely fill the U-shaped gap between opposing sidewalls of the etched conductive layers 102, so that the opposing sidewalls of the conductive layers 102 are isolated from each other. Accordingly, the interference phenomenon between adjacent conductive layers 102 can be improved.

As described above, according to the invention, a floating gate is partially etched to have a U shape. Accordingly, the interfacial area of the floating gate and a control gate can be increased, the coupling ratio can be increased, and the program speed of a cell can be improved.

Furthermore, an isolation layer between the floating gates is partially etched so that a control gate to be formed subsequently is disposed between the floating gates. It is therefore possible to reduce the interference phenomenon.

Although the foregoing description has been made with reference to the illustrated embodiments, it is to be understood that changes and modifications may be made by the ordinarily skilled in the art without departing from the spirit and scope of the disclosure and appended claims.

What is claimed is:

1. A method of manufacturing a flash memory device, comprising the steps of:
    forming a tunnel oxide layer and a conductive layer for a floating gate over a semiconductor substrate;
    etching a portion of the conductive layer, the tunnel oxide layer, and the semiconductor substrate to form trenches;
    forming isolation layers at the trenches, wherein the isolation layers project above floating gate;
    forming spacers on exposed sidewalls of the isolation layers projecting above the conductive layer;
    etching the conductive layer using the spacers as an etch mask, thereby forming a U-shaped conductive layer;
    removing the spacers;
    etching the top surface of the isolation layers, thereby controlling an Effective Field Height (EFH) of the isolation layer; and
    forming a dielectric layer and a second conductive layer for a control gate on the resulting surface.

2. The method of claim 1, further comprising, before the step of forming the trenches, performing a wall formation ion implant process and an ion implant process for controlling threshold voltage on the semiconductor substrate.

3. The method of claim 1, wherein the step of forming the trenches comprises the steps of:
    sequentially forming the tunnel oxide layer, the conductive layer for the floating gate, a buffer oxide layer, and a nitride layer over the semiconductor substrate;
    performing an etch process employing a mask to pattern the nitride layer; thereby forming a hard mask;
    performing an etch process using the hard mask, sequentially etching the buffer oxide layer, the conductive layer for the floating gate, and the tunnel oxide layer, thereby exposing a specific region of the semiconductor substrate; and
    etching the specific region of the exposed semiconductor substrate to form the trenches.

4. The method of claim 1, wherein the conductive layer for the floating gate and the second conductive layer for the control gate each comprise a polysilicon layer.

5. The method of claim 1, wherein the step of forming the spacers comprises the steps of:
    forming an oxide layer above the resulting structure of the semiconductor substrate including the isolation layers and the conductive layer for the floating gate; and
    performing an etch process to form the spacers such that the oxide layer remains only on sidewalls of the isolation layers projecting above the floating gate.

6. The method of claim 5, wherein the oxide layer has a thickness of 50 Angstroms to 100 Angstroms.

7. The method of claim 1, wherein the U-shaped conductive layer comprises a bottom portion having a thickness in a range of 300 Angstroms to 500 Angstroms.

8. The method of claim 1, wherein the step of etching the conductive layer comprises using an etch gas selected from the group consisting of $HBr/O_2$, $HBr/Cl_2/O_2$, and $Cl_2/O_2$, wherein the etch gas has a high etch selectivity relative to an oxide.

9. The method of claim 1, wherein the U-shaped conductive layer comprises a bottom portion and a sidewall, the angle between the bottom portion and the sidewall being in a range of 91 degrees to 95 degrees.

10. The method of claim 1, wherein the step of etching the top surface of the isolation layers to control the EFH comprises performing an oxide layer recess process so that the resulting EFH of the isolation layer is in the range of 200 Angstroms to 400 Angstroms.

* * * * *